United States Patent [19]

Grabbe

[11] 4,410,906
[45] Oct. 18, 1983

[54] VERY HIGH SPEED LARGE SYSTEM INTEGRATION CHIP PACKAGE AND STRUCTURE

[75] Inventor: Dimitry G. Grabbe, Lisbon Falls, Me.

[73] Assignee: AMP Incorporated, Harrisburg, Pa.

[21] Appl. No.: 292,988

[22] Filed: Aug. 14, 1981

[51] Int. Cl.³ .................... H01L 39/02; H01L 23/48; H01L 29/44
[52] U.S. Cl. .................................. 357/80; 357/70; 357/68; 29/576 R; 29/589; 428/620
[58] Field of Search ............................ 357/70, 80, 68; 361/421; 29/576, 589, 591, 827; 428/596, 620, 674

[56] References Cited

U.S. PATENT DOCUMENTS 3,648,122  3/1972  Berglund et al. ............... 29/576 X
4,366,342  12/1982  Breedlove ......................... 357/80 X Primary Examiner—Andrew J. James
Assistant Examiner—Seth Nehrbass
Attorney, Agent, or Firm—Donald M. Boles

[57] ABSTRACT

A package and system for elimination or reduction to a minimum of reflection of the signal when transmitting from a substrate into an integrated circuit package at very high speed. This is accomplished by providing a conductor grid at a proper distance from a conductor plane to act as a reference ground plane. The grid is designed so that the difference of coefficient of expansion of the ceramic insulator and the metal conductors, which results in the deformation of the plane substrate surface due to "bimetallic" effects, is essentially cancelled due to the symmetrical construction with about the same amount of the same metal placed on both sides of the ceramic substrate. In this way, forces provided due to the thermal mismatch are mutually cancelled.

4 Claims, 2 Drawing Figures

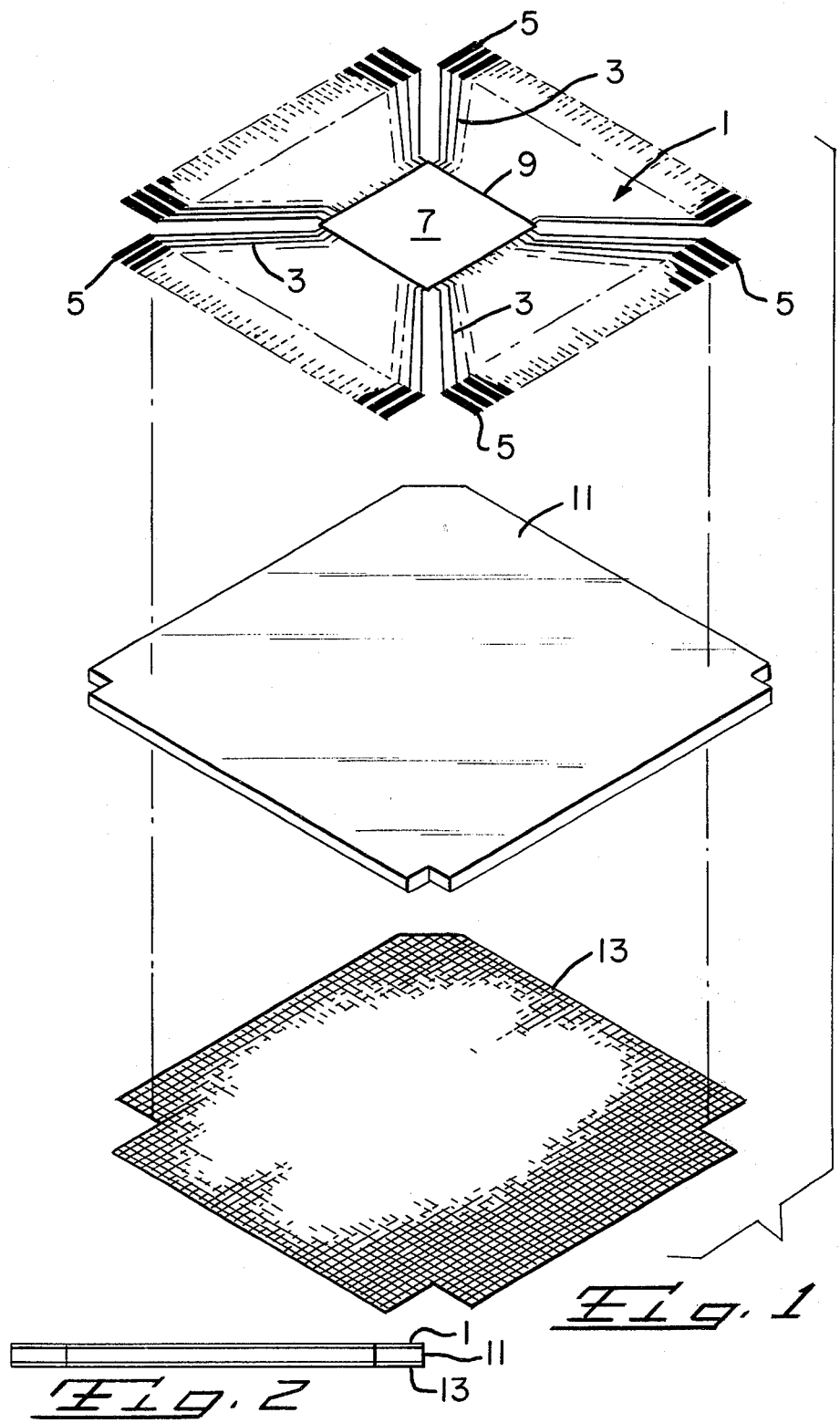

VERY HIGH SPEED LARGE SYSTEM INTEGRATION CHIP PACKAGE AND STRUCTURE

BACKGROUND OF THE INVENTION

1. Field of the Invention

This invention relates to a semiconductor chip carrier for use with very high speed large system integrated circuits and systems for providing superior electrical performance packages for such high speed switching.

2. Description of the Prior Art

In the prior art, integrated circuit chips have continually been applied to increasingly higher frequency operations. The frequencies now being utilized are less than a nanosecond in speed. As is known, at such speeds, the interconnecting network is a transmission line designed for a specific characteristic impedance in order to optimize signal propagation speed, integrity and also to minimize reflections which occur when a discontinuity of the strip line or micro-strip line occurs.

To accomplish this, not only must the module substrate, such as the printed circuit board or the like, have controlled transmission line properties, but also the lead frame of the integrated circuit package should be placed as close to the chip itself as possible. If the gap in the reference plane is less than one quarter of a wave length of the signal no noticeable reflection occurs. At the present speeds which are being approached with use of integrated circuits, the rise and fall times equal a fraction of a nanosecond.

In order to form a transmission line, a conductor is required which is properly spaced from a large conductor with the proper dielectric therebetween. By adjusting the area and thickness for a given dielectric constant one can design a correct impedance transmission line. In integrated circuit packages, the lead from the outside of the package of the chip is frequently larger than one quarter of the wave length of the input signal and therefore provides a discontinuity. To provide a center region in the dielectric for chip attachment that is sufficiently flat, thick materials must be used. When the materials are thick it is not possible to have low impedance because this requires a thick dielectric. The transmission line includes a lead frame and a ground plane separated by a dielectric.

SUMMARY OF THE INVENTION

The above is accomplished by providing a package and system for elimination or reduction to a minimum of reflection of the signal when transmitted from a substrate into an integrated circuit package at very high speed. This is accomplished by providing a conductor grid at a proper distance from a conductor plane to act as a reference ground plane. The grid is designed so that the differences of coefficient of expansion of the ceramic insulator and the metal conductors, which results in the deformation of the plane substrate surface due to "bimetallic" effects, is essentially cancelled due to the symmetrical construction with about the same amount of the same material placed on both sides of the ceramic substrate. Also, the conductor grid or lead frame as well as conductor or ground plane are preferably formed of copper and secured to the dielectric substrate by forming copper oxide on one surface of the copper element and then bonding the copper oxide to the dielectric by the procedures set forth in the patents of Burgess et al. U.S. Pat. Nos. (3,744,120), Babcock et al. (3,766,634), Burgess et al. (3,854,392), Burgess et al. (3,911,553), Cusano et al. (3,994,430) and Cusano et al. (4,129,243). The dielectric is preferably a ceramic, such as aluminum oxide or beryllium oxide. In this way, forces provided due to thermal mismatch are mutually cancelled.

BRIEF DESCRIPTION OF THE DRAWINGS

FIG. 1 is an exploded view of a chip carrier in accordance with the present invention;

FIG. 2 is an assembled view in section of the carrier of FIG. 1.

DESCRIPTION OF THE PREFERRED EMBODIMENT

Referring now to FIG. 1, there is shown an exploded view of a carrier for very high speed large system integration chip. The system includes a copper lead frame 1, having a plurality of leads 3 terminating in pads 5 and a central region 7 wherein the chip (not shown) is placed. A frame 9 is shown at the center of the lead frame 1, the frame being a heat conductor and being attachable to an external heat sink element for removing heat from the system. The lead frame 1 is formed on and secured to the upper surface of a substrate 11 which is formed preferably of a ceramic material such as aluminum oxide, beryllium oxide or the like. Secured to the bottom surface of the substrate 11 is a grid 13 which is formed of crossing members of substantially the same material or of other material having substantially the same coefficient of thermal expansion as the lead frame 1. The grid 13 is perforated in order to provide two functions, one to roughly match the strength of the copper to the copper of the lead frame side and, second, to vent any gases that may form and create blisters during the direct copper bonding process described in the above noted patents.

FIG. 2 is a cross sectional view of the elements of FIG. 1 shown in their assembled state. The conductor grid 13 is placed at the proper distance from the conductor plate 1 as determined by the substrate 11 to act as a reference ground plane. The frame 1 is designed to satisfy the electrical requirements of the system but proportioned so that the differences in coefficient of thermal expansion of the ceramic insulating substrate 11 and the metal conductors 1 and 13, which normally result in the deformation of the plane surfaces of the substrate due to the "bimetallic" effect, are essentially cancelled due to the symmetrical construction of the conductor structure. The same weight of the same or like material is placed on both sides of the ceramic substrate to provide this result. In this way, the forces due to thermal mismatch on both sides of the substrate are mutually cancelled. For this reason, deformation of the ceramic-metal pairs will be minimal with the stress on the semiconductor chip being absent, the electrical properties of the system will remain substantially constant, even under changing heat conditions. This is due to the fact that the resulting package remains flat as it goes through the thermal cycles.

Though the invention has been described with respect to a preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A substrate system for high speed large system integration comprising:
   (a) a substrate of electrically insulating material;
   (b) a system of electrically conductive leads secured to a first surface of said substrate, said system having a predetermined coefficient of thermal expansion and a predetermined volume; and
   (c) a grid of electrically conductive material secured to a second surface of said substrate, opposite said first surface, said grid having a coefficient of thermal expansion substantially the same as said system of leads and having a weight substantially the same as said system of conductive leads.

2. A substrate system as set forth in claim 1 further including a heat conductor formed at the interior of said system of leads.

3. A substrate system as set forth in claim 1 wherein said substrate is a ceramic material.

4. A substrate system as set forth in claim 2 wherein said substrate is a ceramic material.

* * * * *